(12) United States Patent
Henriksen et al.

(10) Patent No.: US 11,540,064 B2
(45) Date of Patent: Dec. 27, 2022

(54) HEARING AID INCLUDING INDUCTION COIL

(71) Applicant: Oticon A/S, Smørum (DK)

(72) Inventors: Poul Henriksen, Veksø (DK); Mikkel Nielsen, Solrød Strand (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 17/162,730

(22) Filed: Jan. 29, 2021

(65) Prior Publication Data

US 2021/0243538 A1   Aug. 5, 2021

(30) Foreign Application Priority Data

Jan. 31, 2020   (EP) .................................. 20154892

(51) Int. Cl.
*H04R 25/00*   (2006.01)
*B33Y 50/02*   (2015.01)
(Continued)

(52) U.S. Cl.
CPC ......... *H04R 25/602* (2013.01); *B29C 64/393* (2017.08); *B33Y 50/02* (2014.12);
(Continued)

(58) Field of Classification Search
CPC .. H04R 25/602; H04R 25/552; H04R 25/554; H04R 25/604; H04R 25/658; H04R 2225/025; H04R 2225/31; H04R 2225/51; H04R 2225/77; H04R 1/1025; H04R 25/652; H04R 25/00; H04R 25/60;
(Continued)

(56) References Cited

U.S. PATENT DOCUMENTS

| 4,379,988 A | 4/1983 | Mattatall |
| 4,870,688 A * | 9/1989 | Voroba ................. H04R 25/609 381/328 |

(Continued)

FOREIGN PATENT DOCUMENTS

| EP | 1 246 507 A1 | 10/2002 |
| EP | 1 842 248 | 10/2007 |

(Continued)

*Primary Examiner* — Angelica M McKinney
(74) *Attorney, Agent, or Firm* — Birch, Stewart, Kolasch & Birch, LLP

(57) ABSTRACT

There is presented a hearing aid configured to be arranged at least partly in the ear canal of a specific person, the hearing aid comprising a faceplate, a custom ear shell, adapted to fit or match with the ear canal of a specific person, the custom ear shell connected to the faceplate, a rechargeable battery, an induction coil for wireless charging of the rechargeable battery, wherein the induction coil is fixed to the ear shell and furthermore a method for providing a hearing aid, said method comprising obtaining data representative of a shape and/or size of an ear canal of a specific person, establishing a digital model of the custom shell of the hearing aid for said ear canal based on said data, wherein said providing includes determining a position and/or orientation of an induction coil in an inner space of said ear shell, which position and/or orientation increases or maximizes a distance from the outer ear to the faceplate.

14 Claims, 3 Drawing Sheets

(51) Int. Cl.
    *B33Y 80/00*     (2015.01)
    *H02J 50/90*     (2016.01)
    *H02J 50/10*     (2016.01)
    *B29C 64/393*     (2017.01)
    *G06F 30/10*     (2020.01)
    *H02J 7/02*     (2016.01)
    *B29L 31/00*     (2006.01)

(52) U.S. Cl.
CPC .............. *B33Y 80/00* (2014.12); *G06F 30/10* (2020.01); *H02J 7/02* (2013.01); *H02J 50/10* (2016.02); *H02J 50/90* (2016.02); *H04R 25/552* (2013.01); *H04R 25/554* (2013.01); *H04R 25/604* (2013.01); *H04R 25/658* (2013.01); *B29L 2031/753* (2013.01); *H04R 2225/025* (2013.01); *H04R 2225/31* (2013.01); *H04R 2225/51* (2013.01); *H04R 2225/77* (2013.01)

(58) Field of Classification Search
CPC ....... B29C 64/393; B33Y 50/02; B33Y 80/00; G06F 30/10; H02J 7/02; H02J 50/10; H02J 50/90; H02J 7/00034; B29L 2031/753; H01F 38/14; H04B 5/0037; H04B 5/0081

See application file for complete search history.

(56) References Cited

U.S. PATENT DOCUMENTS

| | | | |
|---|---|---|---|
| 11,245,989 B2 * | 2/2022 | Nielsen | H04R 25/603 |
| 2002/0136421 A1 * | 9/2002 | Topholm | H04R 25/652 |
| | | | 381/314 |
| 2009/0175475 A1 | 7/2009 | Nikles et al. | |
| 2011/0051965 A1 | 3/2011 | Beck et al. | |
| 2020/0314567 A1 * | 10/2020 | Shriner | H04R 25/65 |

FOREIGN PATENT DOCUMENTS

| | | | |
|---|---|---|---|
| EP | 2 961 033 A1 | 12/2015 | |
| WO | WO-0052964 A2 * | 9/2000 | ........... A61B 5/6817 |
| WO | WO 2006/077192 A1 | 7/2006 | |

\* cited by examiner

HEARING AID INCLUDING INDUCTION COIL

FIELD

The present disclosure relates to a hearing aid. More particularly, the disclosure relates to a hearing aid where an induction coil is arranged in the hearing aid, the coil being used at least for charging a battery of the hearing aid, and the present disclosure furthermore relates to corresponding method and systems.

BACKGROUND

In particular the size of an in-the-ear hearing aid may be considered an important parameter, e.g., as it dictates the amount of users the instruments can fit and/or because a smaller size is advantageous for reducing or eliminating the visual appearance of the hearing aid when placed in an ear canal of the user/wearer. A smaller size, and optionally custom shaped ear shell, however, might also increase demands for vision and dexterity required for providing power to the hearing aid (such as replacing or recharging a discharged battery). Introducing a fixed shaped connection interface may often increase size and/or complexity of the instrument thereby making it less attractive and/or more expensive to make. Further, as hearing aids are often exposed to harsh environments at or in the ear, it is advantageous if the hearing aid has as few as possible openings. As in particular in-the-ear hearing aids are individually shaped, it is not always possible to predict where fixed sized and shaped elements are placed optimally without prior knowledge of each ear canal.

Therefore, there is a need to provide a flexible solution that enables reducing size and/or facilitates (easily and/or simply) providing a variety of functions to the hearing aid.

SUMMARY

According to a first aspect, there is provided a hearing aid configured to be arranged at least partly in the ear canal of a specific person. The hearing aid may comprise a faceplate, or at least a first outer part configured to face the environment if the hearing aid is to be positied at least partly in the ear canal. The hearing aid may comprise a custom ear shell, adapted to fit the ear canal of a specific person/user. The custom ear shell may then be connected to the faceplate or first part. The hearing aid may comprise a rechargeable battery. The hearing aid may comprise an induction coil, such as a hearing aid induction coil, for wireless charging of the rechargeable battery. The inductive coil may serve other purposes as well, such as communication, programming etc.

When charging a custom made Hearing Instrument with a rechargeable battery, the very small and individually shaped instruments may be difficult to connect to either by electrical contact or without contact. Other than making the charging difficult to do from a technical perspective, it may also make it increasingly difficult for the user to handle the charging situation because better vision and dexterity is required in turn. Introducing a well defined connection interface may often increase size and/or complexity of the instrument thereby making it less attractive and/or more expensive to make.

Hearing aid may be referred to interchangeably with Hearing Instrument or Instrument.

At least some, such as all, hearing aids, such as custom styles e.g. IIC (Invisibly In Canal) and Completely In Canal (CIC), have shapes which are wider than higher that causes the instrument to naturally fall on one face, and if an induction coil is placed in the same plane as this face, inductive charging is made possible if an induction coil is placed in the Instrument, and more efficient if the coil is located at this face. The orientation is important because it allow a better and more suitable coupling between the one or more induction coils in the (external) charger and the Instrument; as parallelly orientated planes are typically desirable. It might be of advantage if the hearing aid induction coil is thin and flexible and free floating to allow it to adapt to the many shapes custom instruments have.

It may thus be seen as an advantage of the present invention that it facilitates charging in an easy and simple manner, where the requirements to vision and dexterity may be seen as limited or low, e.g., since it may only be required to place the hearing aid on or in a charger, and since the induction coil may then—being fixed to or by the ear shell—be oriented in an appropriate position for charging. This may dispense with the need for carefully placing electrical leads in contact with charging pads or carefully positioning and/or orienting the hearing instrument into a suitable position and/or orientation for charging.

Additionally, when designing a custom Hearing Instrument, each Hearing Instrument is made to fit the individual user's ear canal. As it needs to have room for all the parts that the Hearing Instrument is made from, the shape of the parts and their placements become a restriction in the design and subsequently size of the Instrument. The Instrument size is an important parameter as it dictates the amount of users the instruments can fit. An advantage of fixing the induction coil to the ear shell may be that there may then be no restrictions with respect to the orientation of the induction coil, such as the orientation of the induction coil with respect to the faceplate, which may in turn entail that the position and/or orientation of the induction coil may be optimized with respect to a size of the hearing aid, which may then in turn enable that the hearing aid may be less visible or not visible at all during use. Alternatively, or in combination therewith, the coil may be fixed by the shell, meaning that the coil may be placed inside the ear shell at a location or volume or area where at least part of the coil abut the inner surface of the ear shell so that this or these parts help hold the coil in position. Additionally, an optional adhesive may be applied in either of both cases. The adhesive may be in the form of or include a gel or pad, or other suitable form. Support for holding the induction coil in a desired position and/or orientation may be part of the ear shell, such as the ear shell being a custom made outer shell of the hearing aid, and/or a formable part interfacing the faceplate.

In case the induction coil is to be fastened inside the hearing aid housing, the induction coil may be fixed to the ear shell by any conceivable means, such as glued to the ear shell and/or fixed to the ear shell via an interference fit and/or via a protruding structure on the inner surface of the ear shell and/or via a structure attached to the inner surface of the ear shell. The induction coil may be attached to the faceplate or exclusively to the ear shell. The induction coil may thus be positioned in the space created or established by the custom shell and the faceplate. The induction coil may be formed entirely on a single piece of substrate, with connection(s) to an energy storage to be charged and/or communication interface as described in more detail later.

By 'hearing aid' may generally be understood a hearing device adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal. A 'hearing aid' may be understood as is common in the art, such as a hearing aid adapted to be worn entirely or partly in the pinna and/or in the ear canal of the user.

The hearing aid may be an in-the-ear hearing aid, such as the in-the-ear hearing aid may be an 'In-the-Canal' hearing aid and/or a 'Completely-in-Canal' hearing aid and/or a Invisibly In Canal (IIC) hearing aid and/or a Completely In Canal (CIC) hearing aid. An 'in-the-ear' type hearing aid may be understood to encompass also an 'In-the-Canal' hearing aid and/or a 'Completely-in-Canal' hearing aid and/or a Invisibly In Canal (IIC) hearing aid and/or a Completely In Canal (CIC) hearing aid.

The induction coil may be further configured for communication, such as being operable between the two states (charging and communication), such operation might be dependent on one or more wireless interfaces in the hearing aid. The operation may be shifted intermittently, according to a schedule, dependent on detected conditions. During a charging process, the communication coil may be operated to transmit data from the hearing aid to a charger device in certain time slots, or via a return channel 'on top of'/parallel to the charge being received.

According to the present disclosure, in a hearing aid, an induction coil, such as described herein, may be arranged as a printed material on, or otherwise deposited on, a flexible substrate, such as the substrate being bendable and/or deformable and/or elastic. An advantage of this may be that it enables pushing the coil into a position which does not accommodate its original size, but then due to the flexibility of the substrate, the substrate may bend and/or fold and (slightly) change size/volume thereby enabling fitting the coil into a position in the ear shell previously not suitable to hold a coil (such as without damaging the ear shell).

Advantageously the flexible substrate and the battery are provided as separate components. Even though they may be provided as separate components, it may be arranged so that at least part of them may be attached or connected.

In a hearing aid according to the present disclosure, the material of the flexible substrate may have a Young's modulus being lower than a Young's modulus of the material of the ear shell, such as wherein the substrate deforms when pressed against the ear shell (such as not the opposite way around). This may ensure that the ear shell is not damaged, or at least lower the risk of damaging the shell. The flexibility of the substrate may, alternatively or additionally, be achieved by appropriately choosing a thickness of the substrate that allow for bending or shaping. The flexible substrate may for instance be based on or include a PI (polyimide) film and a PET (polyester) film, with a flexible copper clad laminate, or other suitable printed circuit board technology.

In a hearing aid according to the present disclosure, the induction coil may be arranged with respect to the ear shell so that, when the hearing aid is placed on a planar horizontal surface in an orientation resulting in the center of gravity being closest to the surface, then the induction coil has an orientation being an orientation resulting in maximum (such as maximum being understood to be within an angle of 10°, such as 5°, such as 2°, such as 1°, from an absolutely optimal angle) induced current for a varying, vertical magnetic field. The orientation may be less than optimal, the orientation should at least provide for an adequate field strength so that the battery may be charged. This could be less than maximum induced current. The charger could be configured so at to receive information about the induced current in the coil and/or the charge current for the battery so that when the hearing aid is lying still in/on the charger, the field strength could be increased and/or decreased dependent on a (current) need of the hearing aid.

A hearing aid with a shell shaped for a specific ear canal may include an area specifically shaped so as to achieve that the center of gravity of the hearing aid results in an optimized orientation of the coil relative to a charging coil of an external charger device. This could for instance be one or more areas that together form one or more legs or supports that the hearing aid will rest on while the hearing aid is to be charged.

A possible advantage of this embodiment is that when an external charging magnetic field has vertical field lines, such as is, or includes, a vertical magnetic field, then a maximum charging current is induced when the hearing aid is in its lowest (potential) energy orientation (an orientation resulting in the center of gravity being closest to the surface, i.e., with the minimum potential/gravitational energy), which might typically be the case when the hearing aid is simply (carelessly) laid on a surface, such as a surface of an external charger.

This may be beneficial for enabling simply placing the hearing aid on a surface, i.e., without requiring very much of vision and dexterity, and an optimal charging may ensue.

The coil and/or hearing aid may be formed so that an area vector of the hearing aid induction loop has an area vector making an acute angle with vertical of less than 10°, such as less than 5°, such as less than 2°, such as less than 1°, when the hearing aid is placed on a planar surface in an orientation resulting in the center of gravity being closest to the surface.

In a hearing aid according to the present disclosure, the induction coil may be fixed to the ear shell independently of the faceplate, such as glued to the ear shell and/or fixed to the ear shell via an interference fit and/or via a protruding structure on the inner surface of the ear shell and/or via a structure attached to the inner surface of the ear shell. By 'fixed to the ear shell independently of the faceplate' may be understood that the induction coil is fixed to the ear shell and said fixation is independent of the faceplate, such as the faceplate may be removed while the induction coil is still fixed to the ear shell. It is still encompassed that the induction coil may also be fixed to the faceplate, i.e., the induction coil may be fixed both to the ear shell and the faceplate or fixed exclusively to the ear shell. An advantage of the induction coil being fixed to the ear shell independently of the faceplate may be that it enables removing or mounting the faceplate while the induction coil is (or remains) fixed to the ear shell. Another advantage of having the induction coil fixed to the ear shell independently of the faceplate may be that it enables positioning and/or orienting the induction coil optimally with a view to reduce or minimize a size of the in-the-ear hearing aid.

In a hearing aid according to the present disclosure, the induction coil may be fixed exclusively to the ear shell, such as glued to the ear shell and/or fixed to the ear shell via an interference fit and/or via a protruding structure on the inner surface of the ear shell and/or via a structure attached to the inner surface of the ear shell. An advantage of the induction coil being fixed exclusively to the ear shell may be that it enables removing or mounting other parts, such as the faceplate, while the induction coil is (or remains) fixed to the ear shell. Another advantage of having the induction coil fixed to the ear shell independently of the faceplate may be that it enables positioning and/or orienting the induction coil optimally with a view to reduce or minimize a size of the in-the-ear hearing aid. By an 'interference fit' may also be known as a press fit or a friction fit and may be understood as a fastening between two parts, which is achieved by friction after the parts are pushed together, rather than by any other means of fastening.

In a hearing aid according to the present disclosure, a main axis of the induction coil, such as an axis for which the induction coil may have a minimum moment of inertia, being neither orthogonal nor parallel with a plane of the faceplate, such as a best-fit mathematical plane with respect to the faceplate, such as wherein an angle between said axis and said plane is within [5°; 85°], such as within [10°; 80°], such as within [20°; 70°], such as within [30°; 60°]. A possible advantage of the main axis of the induction coil being neither orthogonal to nor parallel with a plane of the faceplate, may be that it enables an improved orientation of the induction coil for the purpose of reducing or minimizing a size of the in-the-ear hearing aid.

In a hearing aid according to the present disclosure, the faceplate may comprise an antenna configured for radio-wave communication with an external unit, such as comprises an antenna configured for high frequency wireless communication, such as comprises an antenna configured with an operating frequency of 2.4 GHz or 5.8 GHz, or other suitable high frequency. A possible advantage of this may be that it yields an, such as another, channel of communication. By 'configured with an operating frequency of 2.4 GHz' may be understood suitable for the 2.4 GHz industrial, scientific and medical (ISM) radio band. By 'antenna configured with an operating frequency of 2.4 GHz' may be understood an antenna suitable for transmission and/or receipt of electromagnetic signals within the 2.4 GHz ISM band and/or within the wavelength range [2.4; 2.5] GHz. By 'configured with an operating frequency of 5.8 GHz' may be understood suitable for the 5.8 GHz industrial, scientific and medical (ISM) radio band. By 'antenna configured with an operating frequency of 5.8 GHz' may be understood an antenna suitable for transmission and/or receipt of electromagnetic signals within the 5.8 GHz ISM band and/or within the wavelength range [5.725; 5.875] GHz.

A wireless interface in communication with the antenna may be configured to communicate using a communication protocol, such as Bluetooth, such as Bluetooth low energy, a proprietary protocol or other suitable communication protocol.

In a hearing aid according to the present disclosure, the hearing aid may comprises one or more microphones, such as one microphone, such as two microphones. The microphones, or input transducers, may be positioned at or in a faceplate of the hearing aid, or generally in the area of the hearing aid that is configured to face the environment when the hearing aid is worn at least partially in the ear canal of the user/wearer. Each microphone may comprise one, two or more microphone elements, such as two element constituting a directional microphone or one microphone element constituting an omnidirectional microphone, so that a hearing aid comprising two single element microphones together form a directional microphone.

In a hearing aid according to the present disclosure, the induction coil may be placed out of contact with the faceplate, such as not in contact with the faceplate. A possible advantage of placing the induction coil out of contact with the faceplate may be that the position and/or the orientation of the induction coil may be kept independent of the faceplate. Another possible advantage of placing the induction coil out of contact with the faceplate may be that the face plate can be removed without interfering with the position and/or orientation of the induction coil. Another possible advantage of placing the induction coil out of contact with the faceplate may be that the ear shell and induction coil may be assembled prior to mounting of the faceplate.

In a hearing aid according to the present disclosure, the induction coil may float relative to the faceplate or the end of the hearing aid configured to face the environment when the hearing aid is positioned in the ear canal. If the induction coil in the hearing aid is not fixed to the face plate but can float freely to fit optimally the ear canal; e.g. rotate and/or tilt relative to faceplate, hearing aids can be made smaller and a better filtrate obtained, i.e. more users can be fitted with the hearing aids. A floating induction coil is possible. By 'the induction coil floats relative to the faceplate' may be understood that the position and/or orientation of the induction coil may be varied with respect to the faceplate.

In a hearing aid according to the present disclosure the induction coil may be fixed to the ear shell via protrusions monolithically integrated with the ear shell. Said protrusions may enable an interference fit.

In a hearing aid according to the present disclosure, a substrate carrying at least one electronic component may be included, wherein said substrate may carry at least one electronic component which floats relative to the faceplate or is attached to the faceplate.

In a hearing aid according to the present disclosure, a protection layer may be applied to at least one electronic component in the hearing aid. If a protection layer, such as a thin layer of liquid protection, such as epoxy or silicone or polyurethane (PU)) is applied on at least one electronic component, such as the integrated circuits (ICs), such as especially the edges of the ICs, the risk of damage may be dramatically reduced. The effect of the protection layer may vary with the properties, such as the effects being one or more of the effects in the following non-exhaustive list: Stabilisation through filling of (micro-)cracks and/or added force distribution layer and/or cushioning . . . .

In a hearing aid according to the present disclosure, the ear shell maybe formed monolithic, such as made in one part, such as 3D printed. A possible advantage of having the ear shell monolithic may be that it enables one or more of simplified production, simplified assembly and or increased resistance against moisture and liquids.

In a hearing aid according to the present disclosure, the hearing aid may comprise a housing, said housing comprising a faceplate and an ear shell, and wherein the hearing aid further comprises a telecoil arranged within the housing. According to the present disclosure, the induction coil is not a telecoil.

According to the present disclosure, there is presented a plurality of the hearing aids each having to the one or more features of a hearing aid as disclosed in the present disclosure, such as wherein electronic components within each hearing aid of the plurality of hearing aid are identical across the plurality of hearing aids, wherein the shape and/or size of the ear shells are different with respect to each other, such as wherein the shape and/or size of the ear shells are shaped for respective left and right ears of a specific person or group of persons, wherein the ear shells have different geometries with respect to each other, and wherein the positions and/or orientations of the induction coils with respect to the respective faceplate are different with respect to each other hearing aid. A possible advantage of having the shape and/or size of the ear shells being different with respect to each other may be that the hearing aids may then fit different users, such as each hearing aid may be optimized to a specific user. A possible advantage of having the positions and/or orientations of the induction coils with respect to the faceplates being different with respect to each other may be that it enables minimizing or reducing a size of each individual hearing aid.

According to the present disclosure, there is presented a binaural system comprising two hearing aids according to the present disclosure. The hearing aid may be a "binaural (hearing) system", such as a system comprising two hearing aids where the two hearing aids are adapted or configured to cooperatively provide audible signals to a respective one of the user's ears.

According to the present discourse, there is further presented a system comprising a hearing aid according to the present disclosure, a charger comprising a charger induction coil wherein, when the hearing aid may be positioned on/in the charger, the orientation of the hearing aid induction coil with respect to the ear shell may be arranged so that the hearing aid induction coil may have or has an orientation being substantially identical to, such as identical to, an orientation resulting in maximum induced current for a magnetic charging field from the charger induction coil upon said magnetic charging field changing magnitude. An advantage of this system may be that it facilitates charging in an easy and simple manner, where the requirements to vision and dexterity may be seen as limited or low, e.g., since it may only be required to place the hearing aid on or in the charger, and since the induction coil may then—being fixed to the ear shell—be oriented in an appropriate position for charging. This may dispense with the need for carefully placing electrical leads in contact with charging pads or carefully positioning and/or orienting the hearing instrument into a suitable position and/or orientation for charging. By 'substantially identical to' may be understood deviating less than 20°, such as less than 10°, such as less than 5°, such as less than 2°, such as less than 1° from said orientation.

According to the present disclosure, there is presented a method for providing a hearing aid, said method may comprise obtaining data, such as three-dimensional data, representative of a shape and/or size of an ear canal of a specific person, such as an ear canal running at least partially from the outer ear to the middle ear. The method may comprise establishing a digital model of the custom shell of the hearing aid for said ear canal based on said data. The method may comprise said providing including determining a position and/or orientation of an induction coil in an inner space of said ear shell, which position and/or orientation increases or maximizes a distance from the outer ear to the face plate. This method may be beneficial for receiving information regarding the geometry of the ear canal and providing information, such as a computer aided design (CAD) model or another digital model, of an ear shell for said ear canal, wherein a position and/or orientation of a induction coil is optimized with a view to minimize or reduce a size of said ear shell (and/or maximize a distance from the outer ear to the faceplate, which maximization may reduce or eliminate the visibility of the in-the-ear hearing aid during use). A result of this method may be information relating to an ear shell, such as a digital model of the ear shell.

The position and/or orientation of the induction coil may advantageously be optimized during the design of the in-the-ear hearing aid, such as at least during the design of a custom designed part (such as the ear shell) of the hearing aid, and that this optimization may be carried out with a view to minimize or reduce a size of said ear shell (and/or maximize a distance from the outer ear to the faceplate, which maximization may reduce or eliminate the visibility of the in-the-ear hearing aid during use). It may be understood that during the design process, the induction coil may 'float' with respect to the faceplate, such as the position and/or orientation of the induction coil may be optimized independently of the position and/or orientation of the faceplate. This may enable an improved design of the in-the-ear hearing aid with respect to a situation where there is a restriction on the orientation and/or position of the induction coil, such as where the induction coil is in a fixed spatial relationship with the faceplate.

According to the present disclosure a method may be provided for providing a hearing aid and may comprise, such as comprise in this order:

Obtaining the data, such as three-dimensional data, representative of an ear shell for said ear canal, Providing the ear shell, such as via three-dimensional printing (optionally with protrusions enabling interference fit with induction coil) according to said data representative of an ear shell for said ear canal, Attaching, such as via gluing or interference fit, the induction coil (108) to the ear shell, Attaching a faceplate to the ear shell.

A result of this method may be an in-the-ear hearing aid.

The features and/or technical details outlined above may be combined in any suitable ways.

According to a first alternative aspect, such as an aspect not necessarily limited by the features of the appended claims, there is presented a hearing aid configured to be arranged at least partly in the ear canal of a specific person, the hearing aid comprising:

A faceplate

A custom ear shell, adapted to fit the ear canal of a specific person, the custom ear shell connected to the faceplate, A rechargeable battery, An induction coil, such as a hearing aid induction coil, for wireless charging of the rechargeable battery, wherein the induction coil is fixed to the faceplate. This first alternative aspect may be combined with any embodiment of the present disclosure and/or the features of any one of the dependent claims (such as not necessarily including the subject-matter of the independent claim to which the dependent claim refers).

According to the first alternative aspect, there may be provided a hearing aid wherein a main axis of the induction coil, such as an axis for which the induction coil has a minimum moment of inertia, is neither orthogonal nor parallel with a plane of the faceplate, such as a best-fit mathematical plane with respect to the faceplate, such as wherein an angle between said axis and said plane is within [5°; 85°], such as within [10°; 80°], such as within [20°; 70°], such as within [30°; 60°].

According to the first alternative aspect, there may be provided an in-the-ear hearing aid wherein the induction coil is attached to the faceplate via protrusions monolithically integrated with the faceplate or via an insert.

According to the first alternative aspect, there may be provided an in-the-ear hearing aid wherein the induction coil is attached exclusively to the faceplate, such as wherein the induction coil is not attached to the ear shell.

According to a second alternative aspect, such as an aspect not necessarily limited by the features of the appended claims, there may be presented a hearing aid configured to be arranged at least partly in the ear canal of a specific person, the hearing aid comprising:
  A faceplate
  A custom ear shell, adapted to fit the ear canal of a specific person, the custom ear shell connected to the faceplate,
  A rechargeable battery,
  An induction coil, such as a hearing aid induction coil, for wireless charging of the rechargeable battery,
wherein the induction coil floats relative to the faceplate. This second alternative aspect may be combined with any embodiment of the invention and/or the features of any one of the dependent claims (such as not necessarily including the subject-matter of the independent claim to which the dependent claim refers).

According to a third alternative aspect, such as an aspect not necessarily limited by the features of the appended claims, there may be presented a hearing aid configured to be arranged at least partly in the ear canal of a specific person, the hearing aid comprising:
  A faceplate,
  A custom ear shell, adapted to fit the ear canal of a specific person, the custom ear shell connected to the faceplate, such as a custom ear shell,
  A rechargeable battery,
  An induction coil, such as a hearing aid induction coil, for wireless charging of the rechargeable battery,
  A substrate carrying at least one electronic component, such as said electronic component being the induction coil,
wherein said substrate carrying at least one electronic component floats relative to the faceplate or is attached to the faceplate. This third alternative aspect may be combined with any embodiment of the invention and/or the features of any one of the dependent claims (such as not necessarily including the subject-matter of the independent claim to which the dependent claim refers).

The features and/or technical details outlined above may be combined in any suitable ways.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

DETAILED DESCRIPTION

The detailed description set forth below in connection with the appended drawings is intended as a description of various configurations. The detailed description includes specific details for the purpose of providing a thorough understanding of various concepts. However, it will be apparent to those skilled in the art that these concepts may be practised without these specific details. Several aspects of the hearing aid, plurality of hearing aids, binaural system, system and method are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Figure 1:
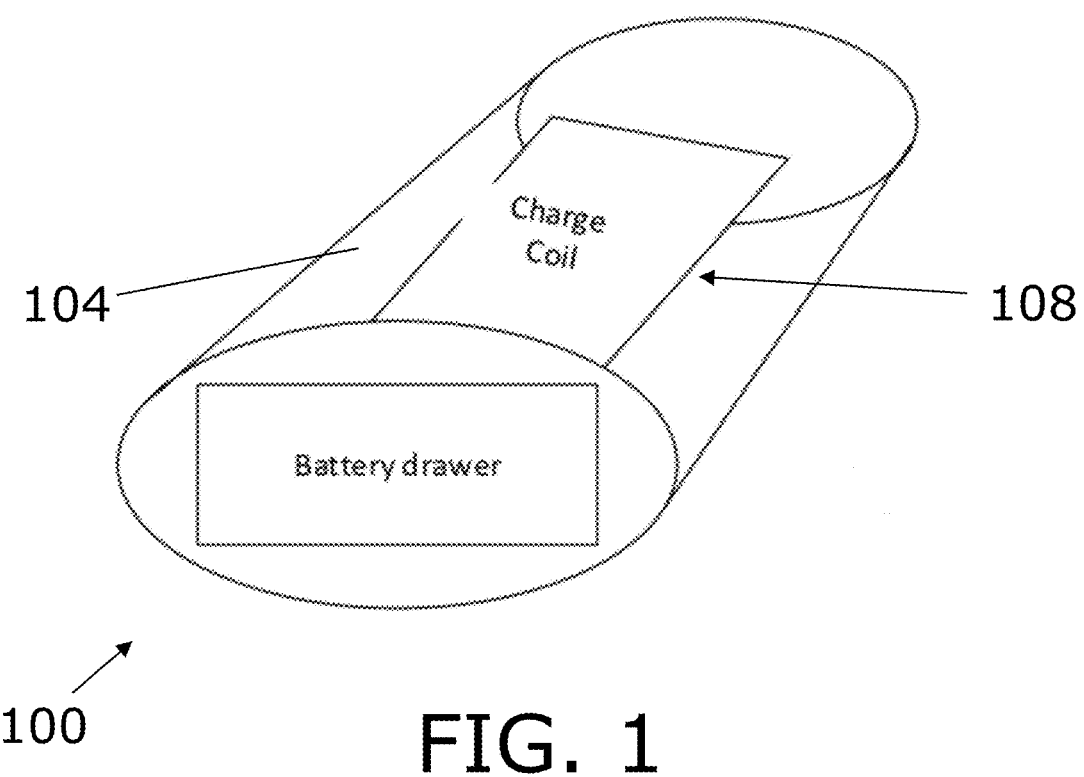
FIG. 1 is a schematic of an in-the-ear hearing aid 100 shown in a perspective view.

FIG. 1 is a schematic of an in-the-ear hearing aid 100 shown in a perspective view. The hearing aid 100 has a battery drawer in a faceplate 102, an ear shell 104 and a charge coil being an induction coil 108. However, as the hearing aid 100 may be rechargeable, the battery drawer need not be of a traditional openable battery drawer type as such, and may be dispensed with, and the battery simply mounted inside the hearing aid 100, e.g. be fastening the battery to the faceplate 102 or elsewhere in the interior of the hearing aid 100. The depicted hearing aid has a shape which is wider than higher which causes the instrument to naturally fall on one face, and the induction coil is placed in the same plane as this face, facilitating inductive charging is made possible with the induction coil placed in the Instrument, which has an induction current generated from a changing magnetic field with vertical field lines. The induction coil 108 is arranged with respect to the ear shell 104 so that, when the hearing aid is placed on a planar horizontal surface in an orientation resulting in the center of gravity being closest to the surface, then the induction coil has an orientation being an within an angle of 10° from vertical. The hearing aid induction coil is thin and flexible and free floating to allow it to adapt to the many shapes custom instruments have.

Figure 2:
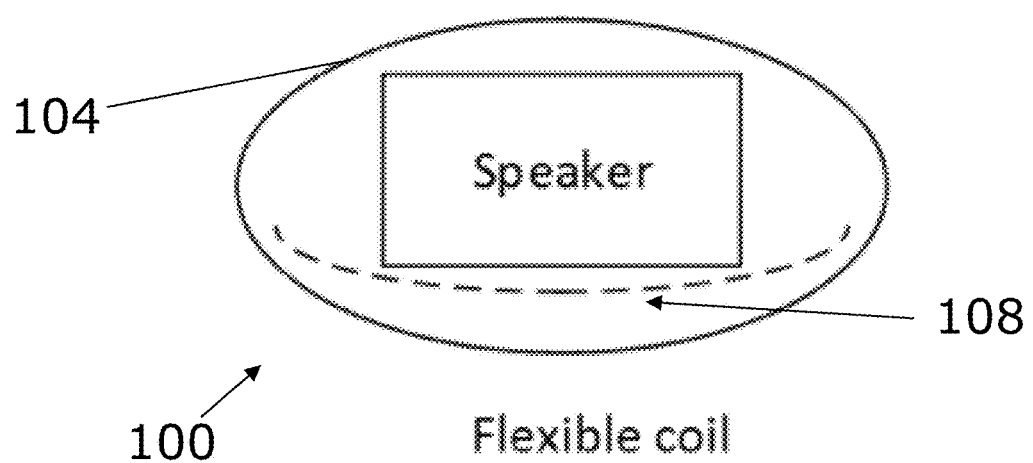
FIG. 2 is a schematic of an in-the-ear hearing aid 100 shown in an end view.

FIG. 2 is a schematic of an in-the-ear hearing aid 100 shown in an end view. The hearing aid 100 has an ear shell 104 and a flexible coil being an induction coil 108. The figure shows the bending of the induction coil enabling it to be wedged into the ear shell and be firmly attached there. The figure furthermore shows a speaker partially around which the induction coil is placed, where the flexibility of the induction coil enables it to fit into the space left in the ear shell after placement of the speaker.

Figure 3:
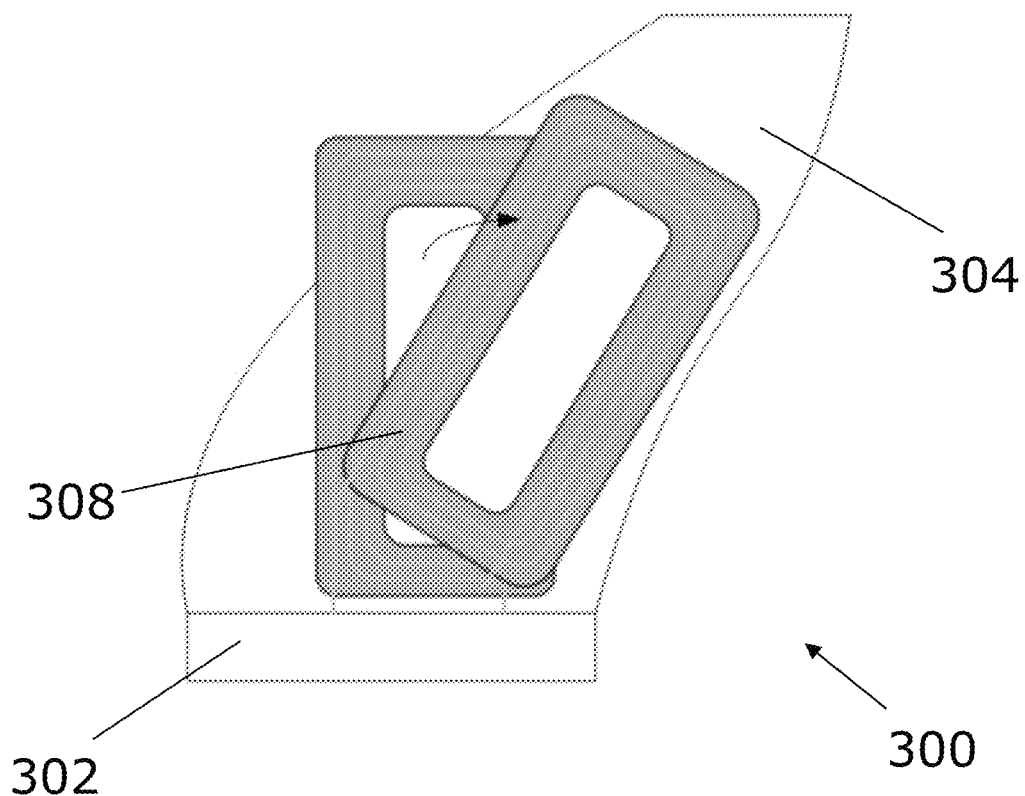
FIG. 3 is a schematic of an in-the-ear hearing aid 100 shown in a side view.

FIG. 3 is a schematic of an in-the-ear hearing aid 100 shown in a side view. A first induction coil, which in this case is a substrate with printed conductors (forming a rectangle with sides being parallel with the sides of the paper and with the horizontal axis) shows an orientation of the induction coil according to a restriction that the induction coil must be placed in this orientation. This restriction may result in an unnecessarily large in-the-ear hearing aid. A second induction coil 308 (forming a rectangle being angled ca. 60° with respect to the rectangle formed by the first induction coil) shows an alternative orientation of the induction coil 308 which may be the result of an optimization with a view to reduce or minimize a size of the in-the-ear hearing aid, and which may result in a smaller in-the-ear hearing aid than what is possible to design with the restriction that the induction coil must be oriented as indicated by the first induction coil.

Figure 4:
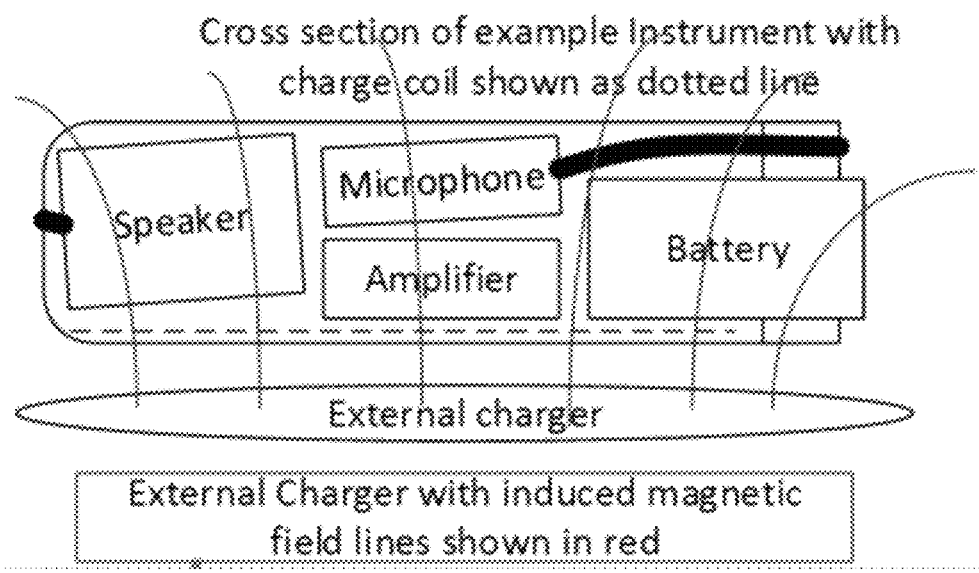
FIG. 4 is a schematic showing a cross section of an example instrument.

FIG. 4 is a schematic showing a cross section of an example instrument with charge coil, being a charger induction coil, shown as a dotted rectangle (in the bottom of the figure). The charger induction coil is placed in an external (to the hearing aid) charger. The charger induction coil provides a varying magnetic field (with varying magnitude) with field lines as shown by the curved dotted lines, such as substantially vertical magnetic field lines. The figure furthermore shows a hearing aid (in the full drawn rectangle with rounded corners) with (from left to right) a speaker, a microphone, an amplifier (below the microphone) and a battery.

Figure 5:
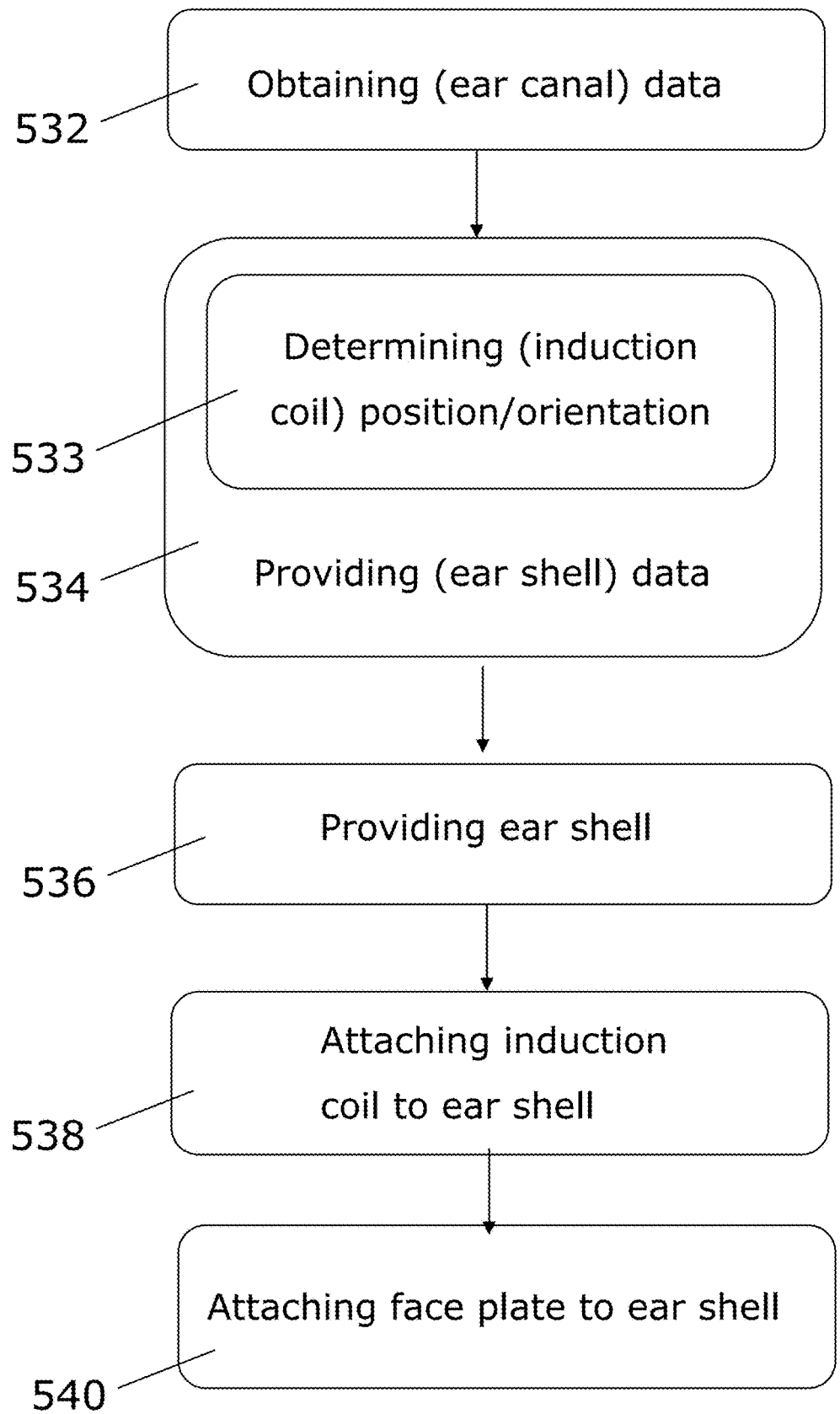
FIG. 5 illustrates a method according to an embodiment of the disclosure.

FIG. 5 illustrates a method according to an embodiment of the disclosure, showing a method for providing a hearing aid, such as a hearing aid according to the first aspect, said method comprising:

Obtaining 532 data, such as three-dimensional data, representative of a shape and/or size of an ear canal of a specific person, such as an ear canal running at least partially from the outer ear to the middle ear, establishing 534 a digital model of the custom shell of the hearing aid for said ear canal based on said data, wherein said providing includes determining 533 a position and/or orientation of an induction coil 108 in an inner space of said ear shell 104, which position and/or orientation increases or maximizes a distance from the outer ear to the faceplate 102, and wherein the method is further comprising, such as comprising in this order:

Obtaining the data, such as three-dimensional data, representative of an ear shell for said ear canal, Providing 536 the ear shell 104, such as via three-dimensional printing (optionally with protrusions enabling interference fit with battery) according to said data representative of an ear shell for said ear canal, Attaching 538 the induction coil 108 to the ear shell, Attaching 540, such as via gluing or interference fit, a faceplate 102 to the ear shell.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A hearing aid configured to be arranged at least partly in an ear canal of a specific person, the hearing aid comprising:
   a faceplate,
   a custom ear shell, adapted to at least partly fit the ear canal of the specific person, the custom ear shell being connected to the faceplate,
   a rechargeable battery arranged in an enclosure formed by the faceplate and custom ear shell, and
   an induction coil for wireless charging of the rechargeable battery, the induction coil being arranged in the enclosure at least partly in contact with the custom ear shell and at a predetermined orientation relative to the custom ear shell,
   wherein the induction coil is arranged as a printed material or deposited material on a flexible substrate, and
   wherein said flexible substrate is flexed when arranged in the enclosure at the predetermined orientation so as to accommodate at least one of a contour of said custom ear shell and another hearing aid component inside the enclosure that would prevent the flexible substrate from fitting within the enclosure at the predetermined orientation in an unflexed state.

2. The hearing aid according to claim 1, wherein the induction coil is separate from the rechargeable battery.

3. The hearing aid according to claim 1, wherein a material of the flexible substrate has a Young's modulus being lower than a Young's modulus of the a material of the custom ear shell and/or the flexible substrate having thickness being smaller than a thickness of the custom ear shell.

4. The hearing aid according to claim 1, wherein the induction coil is arranged with respect to the custom ear shell so that, when the hearing aid is placed on a planar horizontal surface, an orientation of the hearing aid will have a preference for resulting in a center of gravity being closest to the planar horizontal surface.

5. The hearing aid according to claim 1, wherein the induction coil is fixed to the custom ear shell independently of the faceplate.

6. The hearing aid according to claim 1, wherein the induction coil is fixed exclusively to the custom ear shell.

7. The hearing aid according to claim 1, wherein a main axis of the induction coil is neither orthogonal nor parallel with a plane of the faceplate.

8. The hearing aid according to claim 1, wherein the hearing aid comprises an antenna configured for radiowave communication with an external unit.

9. The hearing aid according to claim 1, wherein the faceplate comprises one or more microphones.

10. A plurality or set of the hearing aids according to claim 1, wherein electronic components are identical across the plurality of hearing aids, wherein
shape and/or size of the custom ear shells are different with respect to each other, wherein the shape and/or size of the custom ear shells are shaped for respective left and right ears of the specific person, wherein the custom ear shells have different geometries with respect to each other, and wherein the positions and/or orientations of the induction coils with respect to the respective faceplates are different with respect to each other.

11. A binaural hearing aid system comprising two hearing aids according to claim 1.

12. A system comprising:
the hearing aid according to claim 1,
a charger comprising a charger induction coil,
wherein, when the hearing aid is positioned on/in the charger, an orientation of the hearing aid induction coil with respect to the custom ear shell is arranged to maximize an induced current for a magnetic charging field from the charger induction coil upon said magnetic charging field changing magnitude.

13. A method for providing a hearing aid, said method comprising:
obtaining data representative of a shape and/or size of an ear canal of a specific person,
establishing a digital model of a custom ear shell of the hearing aid for said ear canal at least partly based on said data,
wherein said establishing includes determining a position and/or orientation of an induction coil in an inner space of said custom ear shell, the induction coil being arranged on a flexible substrate, and
wherein said establishing arranges for the flexible substrate to be flexed within the inner space in order to accommodate at least one of a contour of said custom ear shell and another hearing aid component inside the inner space that would prevent the flexible substrate from fitting within the inner space at the determined position and/or orientation in an unflexed state.

14. The method for providing the hearing aid according to claim 13 and further comprising:
obtaining data representative of the custom ear shell for said ear canal,
providing the custom ear shell according to said data representative of the custom ear shell for said ear canal,
arranging the induction coil in the inner space of the custom ear shell according to said establishing, and
attaching a faceplate to/at the custom ear shell.

* * * * *